United States Patent [19]

Mallarapu

[11] Patent Number: 5,563,814
[45] Date of Patent: Oct. 8, 1996

[54] REDUCED CIRCUITRY IMPLEMENTATION FOR COVERTING TWO EQUAL VALUES TO NON-EQUAL VALUES

[75] Inventor: Shobha R. Mallarapu, Kokomo, Ind.

[73] Assignee: Delco Electronics Corporation, Kokomo, Ind.

[21] Appl. No.: 391,794

[22] Filed: Feb. 21, 1995

[51] Int. Cl.⁶ .................... G06F 7/48; G06F 7/50
[52] U.S. Cl. ........................ 364/715.01; 364/770
[58] Field of Search ................. 364/715.01, 770

[56] References Cited

U.S. PATENT DOCUMENTS

| | | | |
|---|---|---|---|
| 3,394,249 | 7/1968 | Abernathy et al. | 364/770 |
| 3,989,940 | 11/1976 | Kihara | 364/770 |
| 4,417,315 | 11/1983 | Russell | 364/770 |
| 4,486,851 | 12/1984 | Christopher et al. | 364/770 |
| 5,027,310 | 6/1991 | Dalrymple | 364/770 |

OTHER PUBLICATIONS

Elliott, "Increment–Decrement Logic" *IBM Technical Disclosure Bulletin* vol. 11 No. 3 Aug. 1968 pp. 297–298 364/770.

"Parallel–Array Incrementing Network" *IBM Tech. Disclosure Bulletin* vol. 27 No. 11 Apr. 1985 pp. 6450–6453 364/770.

*Primary Examiner*—David H. Malzahn
*Attorney, Agent, or Firm*—Jimmy L. Funke

[57] ABSTRACT

An apparatus and method for converting equal multi-bit digital values to non-equal multi-bit digital values that differ by one. The apparatus being an electronic circuit incorporated on an integrated chip, the circuit including an input register, a comparator, logic gates, and an output register. The input register receives at least two multi-bit digital values and supplies these values to the comparator. The comparator compares the values and determines if they are equal. The output of the comparator assumes one of either a logic HI or a logic LO state if the digital values are equal and the other of either a logic HI or logic LO state if the digital values are non-equal. The output of the comparator and the least significant bit associated with each of the multi-bit digital values received by the input register are input into the logic gates. In the event the two multi-bit digital values are non-equal, the logic gates pass the values through the circuit and to the output register in an unchanged form. In the event the two multi-bit digital values are equal, the logic gates manipulate the least significant bit of at least one of the multi-bit digital values so as to result in two non-equal values at the output register. According to the method of the invention, only the least significant bit of either of two equal multi-bit digital values will be changed and the resulting non-equal multi-bit digital values will differ by one.

20 Claims, 3 Drawing Sheets

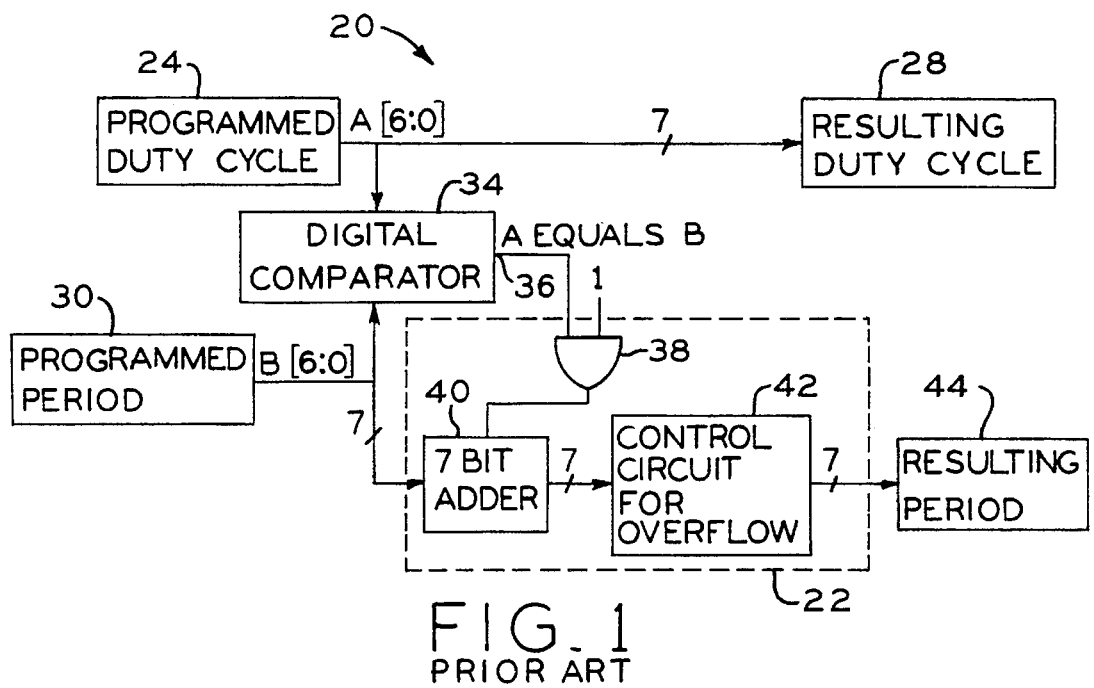
FIG_1
PRIOR ART
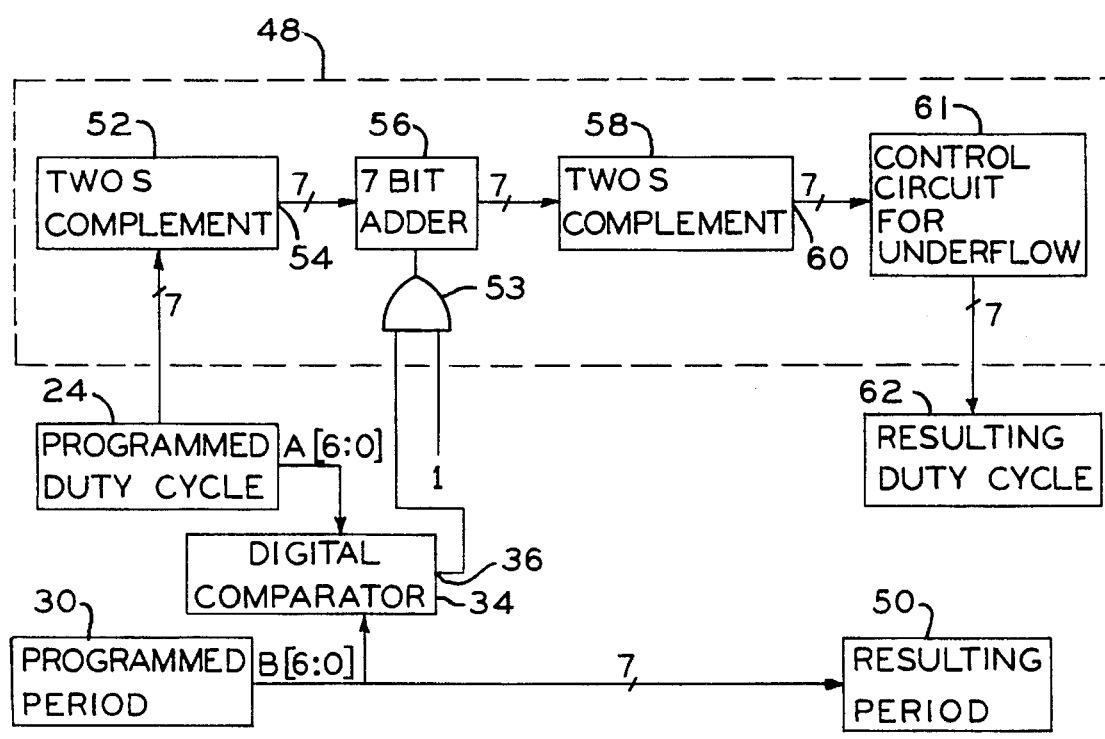
FIG_2
PRIOR ART

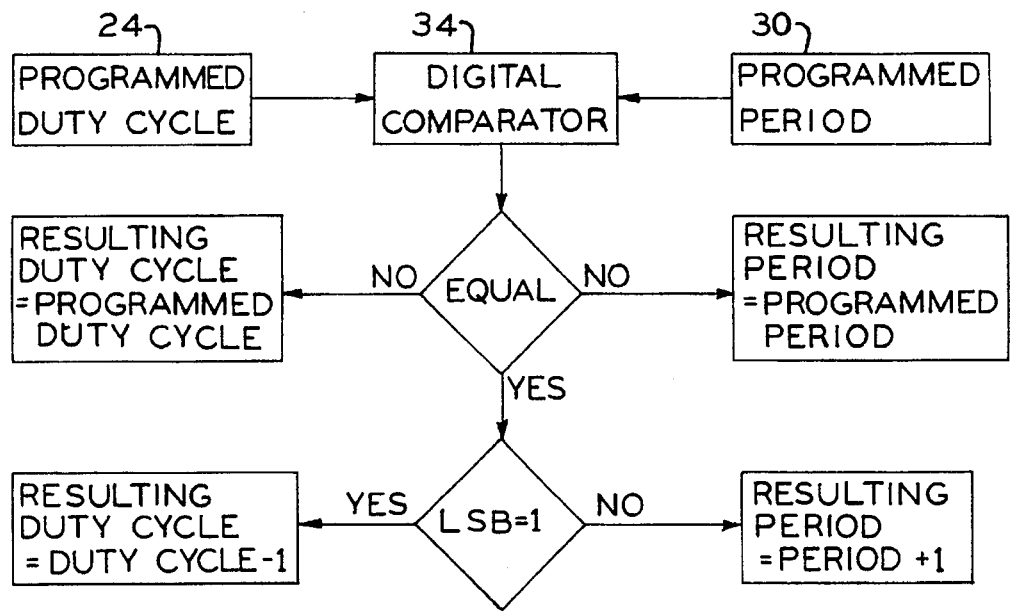
FIG_3
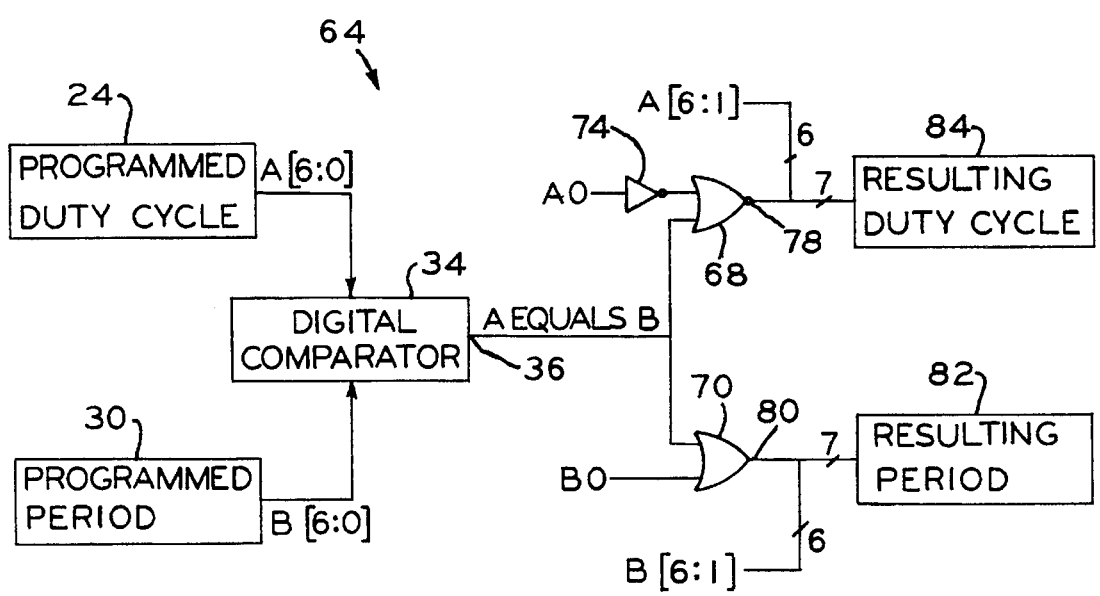
FIG_4

5,563,814

REDUCED CIRCUITRY IMPLEMENTATION FOR COVERTING TWO EQUAL VALUES TO NON-EQUAL VALUES

BACKGROUND OF THE INVENTION

The invention relates generally to integrated electronic circuits which utilize digital information processing devices to generate a desired output based upon information received at a circuit's input and/or as programmed. More specifically this invention relates to an integrated electronic circuit for comparing at least two digital values and, in the event such values are equal, providing at least two non-equal outputs.

A specific implementation of the invention is for use in integrated chips employing a pulse width modulated (PWM) signal to avoid 100% duty cycling. It is general practice for a designer of an integrated chip to utilize a PWM signal to carry out various IC circuit functions. The PWM pulse is defined by period and duty cycle components, the values of which are commonly desired to be non-equal. When both period and duty cycle component values are equal, 100% duty cycling occurs.

A previous method of detecting and avoiding 100% duty cycling was to compare the duty cycle and period values and, in the event that they were equal, either increment or decrement one or the other value by one. In addition to a comparator, this implementation requires an adder which adds a one to the first value or a subtractor (two's complement with adder) which subtracts a one from the second value. Generally, such circuits are dealing with multi-bit values and the modification of adding or subtracting one to the least significant bit of a value would potentially result in effecting a change in all bits associated with that value.

For example, in the case of an incrementer implementation where a seven-bit value represents a duty cycle of 6F in hexadecimal and a second seven-bit value represents a period of 6F, all seven-bits of the period register would require modification to change it to 70. This implementation additionally requires the use of an overflow control circuit for use when the duty cycle and period values are 7F. As another example, in the case of a decrementer implementation where the first seven-bit value represents a period of 70 and the second seven-bit value represents a duty cycle of 70, all 7-bits of the duty cycle register would require modification to change it to 6F. Circuits utilizing the decrementer implementation require converting the duty cycle value to its two's complement, adding one, and converting that value to its two's complement. This implementation also requires a control circuit for underflow conditions such as when the duty cycle and period values are each 00.

SUMMARY OF THE INVENTION

The present invention relates to a method and apparatus of converting equal values to non-equal values that differ by one. The present invention is superior to previous methods in that it is a more efficient circuit design which incorporates a reduced number of circuit components. The present invention uses a digital comparator to determine if two digital values are equal. In the event such values are equal, the circuit utilizes simple logic gates to provide the function of an adder or subtractor so as to always decrement or increment the least significant bit of one of the equal values. In the case of an IC employing a PWM signal, 100% duty cycling may be avoided by manipulating the least significant bit associated with at least one of two equal values.

One advantage associated with the present invention is the reduced level of circuitry needed to convert two equal digital values to non-equal digital values by manipulating only the least significant bit of at least one of the multi-bit values.

Another advantage associated with the present invention is the enhanced operational speed of the circuit due to the utilization of fewer logic gates and the elimination of circuitry required for overflow and underflow conditions.

Yet another advantage of the present invention is the reduction in cost associated with the above noted reduction in circuitry.

In one embodiment, the invention provides an electronic circuit for converting two equal digital values into two non-equal values, wherein the circuit includes an input register, a comparator, logic blocks, and an output register. A data source for providing a first multi-bit digital value and a second multi-bit digital value is connected to the input of the input register. The comparator receives the two digital values output from the input register and compares them to determine if they are equal. The comparator provides one of either a logic HI or a logic LO output in the event the two values are equal and the other of either a logic HI or logic LO output in the event the two values are not equal. The logic blocks receive the comparator output and the least significant bit associated with each respective multi-bit digital value and, in the event the values are equal, manipulates only the least significant bit of at least one of the multi-bit digital values so as to provide an output of two non-equal values. These two non-equal values are then received at the input of the output register as the least significant bit of each respective multi-bit digital value. The remaining most significant bits associated with each multi-bit digital value are passed through the circuitry and received unchanged at the output register. Accordingly, two equal values entering the circuit will exit the circuit as two non-equal values having different least significant bits. While other individual bits may be manipulated in lieu of the least significant bit, this will generally adversely affect circuit operation by distorting the resulting digital values as compared to the desired input digital values.

BRIEF DESCRIPTION OF THE DRAWINGS

The above-mentioned and other features and objects of this invention, and the manner of attaining them, will become more apparent and the invention will be better understood by reference to the following description of embodiments of the invention taken in conjunction with the accompanying drawings, wherein:

FIG. 1 is a block diagram of a prior art incrementer circuit;

FIG. 2 is a block diagram of a prior art decrementer circuit;

FIG. 3 is a logic flow chart representing the method of converting two equal values to non-equal values according to the present invention;

FIG. 4 is a block diagram of the conversion circuit of the present invention.

Corresponding reference characters indicate corresponding parts throughout the several views. The exemplifications set out herein illustrate a preferred embodiment of the invention, in one form, and such exemplifications are not to be construed as limiting the scope of the invention in any manner.

DETAILED DESCRIPTION OF THE INVENTION

Figure 5:
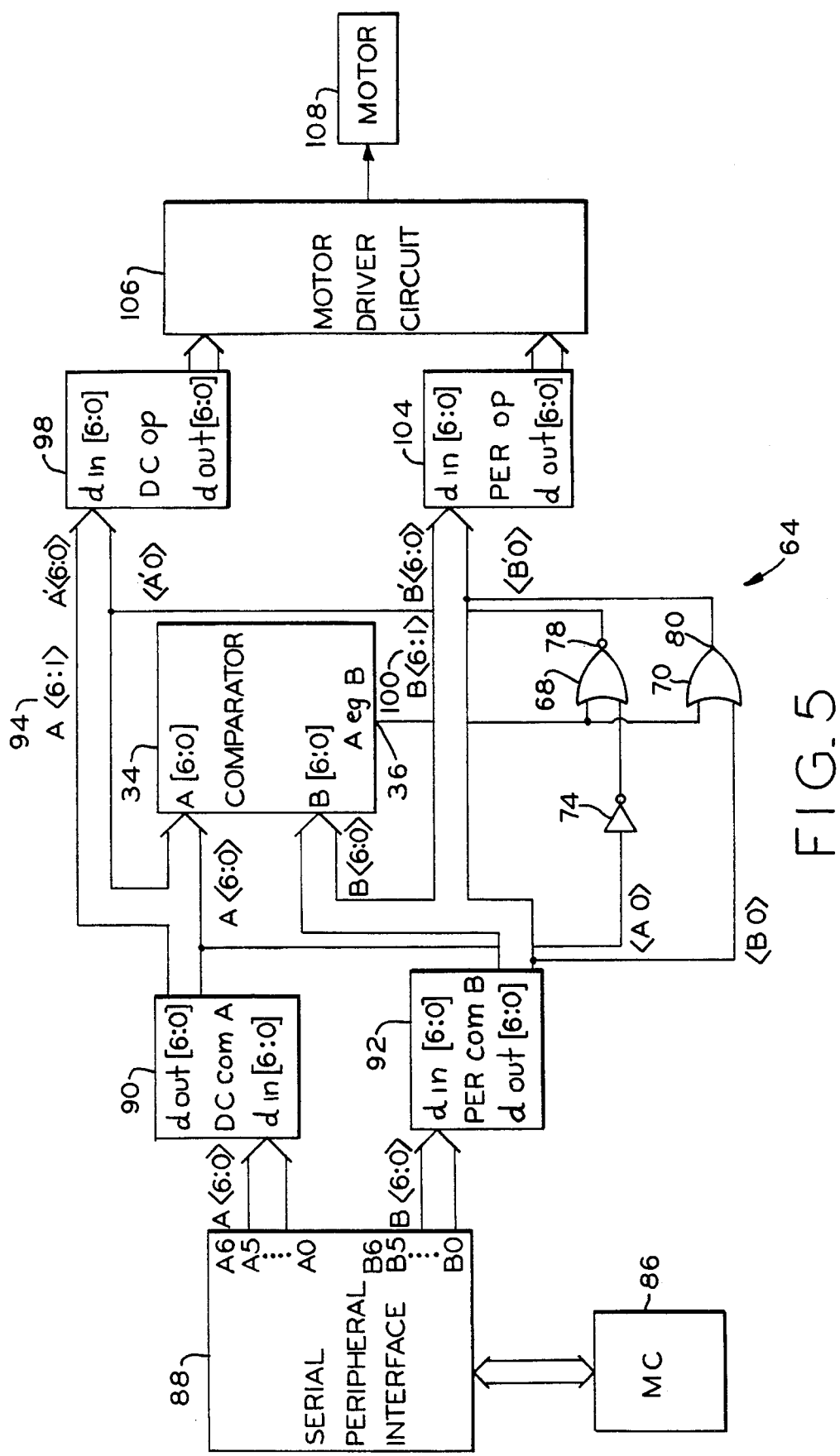
FIG. 5 is a schematic diagram of the value conversion circuit of the present invention.

FIG. 1 illustrates prior art value conversion circuit 20 having internal incrementer implementation circuit 22. Programmed duty cycle 24 represents seven-bit digital value A which is passed through value conversion circuit 20 in an unchanged form as represented by resulting duty cycle 28. Programmed period 30 is introduced into value conversion circuit 20 in the form of seven-bit digital value B. Digital comparator 34 compares digital value A with digital value B to determine if the two values are equal. If the two values are equal, then digital comparator output 36 goes to a logic HI state, thereby forcing the output of AND gate 38 to a logic HI state.

The output of AND gate 38 is fed into seven-bit ADDER 40, which then adds one to digital value B, thereby incrementing the programmed period 30 by one. The incremented value is fed into overflow control circuit 42 which determines if an overflow condition exists. Programmed period 30, after being incremented by one, is then output from incrementer implementation circuit 22 in the form of seven-bit digital value resulting period 44. Accordingly, if programmed duty cycle 24 and programmed period 30 enter value conversion circuit 20 as equal seven-bit digital values, incrementer implementation circuit 22 manipulates programmed period 30 so that resulting output digital values 28 and 44 are non-equal. It is important to note that programmed period 30 is the value being incremented since circuits using PWM signals require that the duty cycle not be greater than the period. An overflow condition exists when the two input digital values A and B are both 7F (hexadecimal) and the incremented value would be 80 hexadecimal. Since this would require an eight-bit binary representation and the digital value is only seven-bits, there is an overflow of one bit. Typically in such a situation the overflow control circuit will prevent the period value from being incremented and will decrement the duty cycle by one. As compared to the present invention, discussed in detail later, the prior art incrementer circuit of FIG. 1 requires significantly more circuitry.

FIG. 2 represents prior art value conversion circuit 46 having decrementer implementation circuit 48. Programmed period 30 again represents seven-bit digital value B which is again fed into the input of digital comparator 34. However, in this circuit, as opposed to that of FIG. 1, programmed period 30 is passed through circuit 46 in an unchanged form as represented by resulting period 50. Programmed duty cycle 24 again represents seven-bit digital value A which is again fed into the input of digital comparator 34. However, in this circuit, as opposed to that of FIG. 1, digital value A is fed into decrementer implementation circuit 48 for processing. Two's complement generator 52 receives digital value A and outputs the two's complement of such value at output 54 in the form of a seven-bit digital value. As illustrated in the circuit of FIG. 1, the output of digital comparator 34 goes to a logic HI state when digital value A and digital value B are equal, thereby forcing the output of AND gate 53 to a logic HI state.

Seven-bit ADDER 56 receives the multi-bit two's complement of digital value A as generated by two's complement generator 52 and adds the one provided at the output of AND gate 53 to that value. The incremented value is then fed into two's complement generator 58 which generates the two's complement of the incremented value of two's complement generator 52. Resulting two's complement output 60 represents the seven-bit digital value A of programmed duty cycle 24 as decremented by one. Underflow control circuit 61 receives this decremented value and determines if an underflow condition exists i.e., if the two equal values enter the circuit having a value of 00 hexadecimal. When no such underflow condition exists, the decremented value is output from decrementer implementation circuit 48 in the form of seven-bit digital value resulting duty cycle 62 which represents a value one less than programmed duty cycle 24. Accordingly, if programmed duty cycle 24 and programmed period 30 are equal values, then value conversion circuit 46 manipulates programmed duty cycle 24 so as to provide an output of two non-equal digital values, which are represented by resulting period 50 and resulting duty cycle 62. The value of resulting duty cycle 62 will always be at least one less than the value of resulting period 50. In this manner 100% duty cycling is avoided. In the event an underflow condition exists, the underflow control circuit prevents the duty cycle value from being decremented and increments the period value by one. As compared to the present invention, discussed in detail later, the prior art decrementer circuit of FIG. 2 requires significantly more circuitry.

FIG. 3 represents a logic flow chart associated with the value conversion circuit of the present invention. The numerical values of programmed duty cycle 24 and programmed period 30 are compared for equality by digital comparator 34. If the two values are not equal, then the resulting duty cycle is equal to programmed duty cycle 24 and the resulting period is equal to programmed period 30. If the two values are equal and their least significant bits are a logic "1", then the resulting duty cycle is equal to programmed duty cycle 24 minus one and the resulting period equals programmed period 30. If the two values are equal and the least significant bits equal zero, then the resulting period equals programmed period 30 plus one and the resulting duty cycle equals programmed duty cycle 24.

FIG. 4 represents a block diagram of value conversion circuit 64 of the present invention. Value conversion circuit 64 receives programmed duty cycle 24 (seven-bit digital value A) and programmed period 30 (seven-bit digital value B). Digital comparator 34 compares digital values A and B and determines if the values are equal. Output 36 of digital comparator 34 is connected to each of the respective inputs of NOR gate 68 and OR gate 70. If digital value A is equal to digital value B, then output 36 will be at a logic HI state. Conversely, if the two values A and B are not equal, then output 36 will be at a logic LO state. Least significant bit A0 of digital value A is fed into the input of inverter gate 74, the output of which is fed into the input of NOR gate 68. Least significant bit B0 of digital value B is input into OR gate 70. If digital value A is equal to digital value B, then output 36 is at a logic HI state, thereby driving output 78 of NOR gate 68 to a logic LO or zero state and also driving output 80 of OR gate 70 to a logic HI or one state. It is thereby ensured that the value of resulting period 82 is always at least one greater than the value of resulting duty cycle 84 and that 100% duty cycling is avoided. If values A and B are not equal, then respective least significant bits A0 and B0 will pass unchanged through the circuit, and the value of resulting duty cycle 84 will equal the value of programmed duty cycle 24 and the value of resulting period 82 will equal the value of programmed period 30.

FIG. 5 represents value conversion circuit 64 of the present invention as implemented in a microprocessordriven integrated circuit. Microprocessor 86 supplies sixteen-bit strings of information, including seven-bit digital values A and B, to serial peripheral interface 88. Serial peripheral interface 88 feeds seven-bit digital value A into duty cycle input register 90 and seven-bit digital value B into period input register 92. Duty cycle input register 90 feeds digital value A into digital comparator 34 and period register 92 feeds digital value B into digital comparator 34. The least significant bit A0 of digital value A is fed into the input of inverter gate 74, the output of which is fed into the input of NOR gate 68. Least significant bit B0 of digital value B is fed into the input of OR gate 70. Digital comparator output 36 is fed into each of the respective inputs of NOR gate 68 and OR gate 70. Digital comparator 34 compares digital values A and B and determines if the values are equal. If values A and B are equal, then output 36 goes to a logic HI or one state, and if values A and B are unequal, then output 36 goes to a logic LO or zero state.

As described in the circuit of FIG. 4, when values A and B are equal and output 36 is at a logic HI or one state, then OR gate output 80, which represents least significant bit B'0 of digital value B, is at a logic HI or one state and NOR gate output 78, which represents least significant bit A'0 of digital value A, is at a logic LO or zero state. Whenever digital values A and B are unequal, output 36 of digital comparator 34 will be at a logic LO or zero state and the respective least significant bits A0 and B0, as well as remaining most significant bits 94 and 100 of digital values A and B, will pass unchanged through value conversion circuit 64. Least significant bit A'0 is joined with remaining most significant bits 94 of digital value A to form resulting seven-bit digital value A', which is input into duty cycle output register 98. Least significant bit B'0 is joined with remaining most significant bits 100 of digital value B to form resulting seven-bit digital value B', which is input into period output register 104. In this manner, 100% duty cycling is avoided by ensuring that the digital value associated with the duty cycle is always at least one less than the digital value associated with the period. The outputs of duty cycle register 98 and period output register 104 are received by motor driver circuit 106, which drives motor 108. Motor driver circuit 106 is one of many applications wherein the value conversion circuit may be utilized.

The value conversion concept of the present invention has been described herein as being implemented on a fully integrated circuit. It should be understood that the invention may additionally be accomplished by software, discrete components or any combination thereof. Accordingly, while this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The embodiments of the invention in which an exclusive property or privilege is claimed are defined as follows:

1. An electronic circuit for converting two equal values into two non-equal values, one of said values being a first multiple bit digital value having a least significant bit and remaining most significant bits, the other of said values being a second multiple bit digital value having a least significant bit and remaining most significant bits, said circuit comprising:

comparator means for receiving and comparing said first and second multiple bit digital values, said comparator means having an output, said comparator means capable of producing at least two output signals, a first output signal when said values are equal and a second output signal when said values are non-equal; and logic means for receiving said comparator means output and said least significant bit of each of said first and second multiple bit digital values, said logic means manipulating only the least significant bit of at least one of said first and second multiple bit digital values so that their resulting values are rendered non-equal.

2. The electronic circuit of claim 1 in combination with an electronic system utilizing a pulse width modulated signal, including input means comprising a first input register and a second input register, said first input register receiving said first multiple bit digital value, and said second input register receiving said second multiple bit digital value.

3. The electronic circuit of claim 2, wherein said first multiple bit value comprises at least three bits and represents the duty cycle component of the pulse width modulated signal, and said second multiple bit value comprises at least three bits and represents the period component of the pulse width modulated signal.

4. The electronic circuit of claim 1, wherein said logic means comprises at least one of the group consisting of AND, OR, NAND, NOR, and INVERTER gates, said logic means providing a first output and a second output.

5. The electronic circuit of claim 4, further comprising output means, said output means comprising a first output register and a second output register, said first output register receiving said remaining most significant bits of said first multiple bit digital value and said first output of said logic means, said second output register receiving said remaining most significant bits of said second multiple bit digital value and said second output of said logic means, said output means providing on an output thereof at least two non-equal digital values.

6. The electronic circuit of claim 1, wherein said electronic circuit is used to drive a brushed or brushless motor.

7. The electronic circuit of claim 1, wherein said comparator means first output signal is one of either a logic HI or a logic LO signal when said values are equal, and said comparator means second output signal is the other of either a logic HI or a logic LO signal when said values are non-equal.

8. An electronic circuit for converting two equal values into two non-equal values, said circuit comprising:

a data source providing a first multiple bit digital value and a second multiple bit digital value, said first multiple bit digital value having a least significant bit and remaining most significant bits, said second multiple bit digital value having a least significant bit and remaining most significant bits;

an input register receiving and storing said first and second multiple bit digital values, said register having an output;

a comparator having an input and an output, said comparator input receiving said first and second multiple bit digital values from said output of said register, said comparator comparing the values of said first and second multiple bit digital values and producing one of at least two output signals, said comparator producing a first output signal when said values are equal and a second output signal when said values are unequal;

an OR gate having a first input, a second input, and an output, said first input of said OR gate receiving said least significant bit of said first multiple bit digital value, said second input of said OR gate receiving said comparator output;

an inverter gate having an input and an output, said input of said inverter receiving said least significant bit of said second multiple bit digital value;

a NOR gate having a first input, a second input, and an output, said first input of said NOR gate receiving said output of said inverter, said second input of said NOR gate receiving said comparator output;

a first data output register comprising an input for receiving said OR gate output as the least significant bit of said first data output register and said remaining most significant bits of said first multiple bit digital value as the remaining most significant bits of said first data output register; and a second data output register comprising an input for receiving said NOR gate output as the least significant bit of said second data output register and said remaining most significant bits of said second multiple bit digital value as the remaining most significant bits of said second data output register.

9. The electronic circuit of claim 8 in combination with an electronic system utilizing a pulse width modulated signal, wherein said first multiple bit digital value comprises at least three bits and represents the duty cycle component of the pulse width modulated signal, and said second multiple bit digital value comprises at least three bits and represents the period component of the pulse width modulated signal.

10. The electronic circuit of claim 8, wherein said data source comprises a microprocessor, said microprocessor varying said first and second multiple bit digital values in accordance with programmed commands associated with said microprocessor.

11. The electronic circuit of claim 8, wherein said circuit is used to drive either a brushed or brushless motor.

12. The electronic circuit of claim 8, wherein said comparator first output signal is one of either a logic HI or a logic LO signal when said values are equal, and said comparator second output signal is the other of either a logic HI or a logic LO signal when said values are non-equal.

13. A system for converting two equal values into two non-equal values, said system comprising:

a microcomputer means comprising a user interface for receiving programming instructions, an input for receiving information, and an output, said microcomputer means providing a multiple bit digital value representing a duty cycle signal and a multiple bit digital value representing a period signal at said output of said microcomputer means, said duty cycle and period multiple bit digital values respectively having a least significant bit and remaining most significant bits;

a serial interface means for receiving said output of said microcomputer means, comparator means for receiving said duty cycle multiple bit digital value and said period multiple bit digital value, said comparator means comparing the values of said duty cycle and period multiple bit digital values, said comparator means having an output, said comparator means capable of producing at least two output signals, a first output signal when said duty cycle and period values are equal and a second output signal when said duty cycle and period values are non-equal; and logic means for receiving said output of said comparator means and said least significant bit of each of said duty cycle and period multiple bit digital values, said logic means manipulating the least significant bit of at least one of said duty cycle and period multiple bit digital values so that their resulting values are rendered non-equal, said logic means providing respectively a duty cycle and a period multiple bit digital value least significant bit; and output register means for receiving a first multiple bit digital value and a second multiple bit digital value, said output register means receiving said output of said logic means as the least significant bit for each respective first and second multiple bit digital values, said output register means receiving said remaining most significant bits from said duty cycle multiple bit digital value as the most significant bits for said first multiple bit digital value, said output register means receiving said remaining most significant bits from said period multiple bit digital value as the most significant bits for said second multiple bit digital value, said output register means providing two non-equal multiple bit digital values.

14. The electronic circuit of claim 13, wherein said comparator means first output signal is one of either a logic HI or a logic LO signal when said duty cycle and period values are equal, and said comparator means second output signal is the other of either a logic HI or a logic LO signal when said duty cycle and period values are non-equal.

15. The electronic circuit of claim 13, wherein said circuit is used to drive either a brushed or brushless motor.

16. The electronic circuit of claim 13, wherein said logic means comprises at least one of the group consisting of AND, OR, NAND, NOR, and INVERTER gates, said logic means providing a first output and a second output.

17. A method for converting two equal values into two non-equal values, the method comprising the steps of:

a) receiving a first multiple bit digital value and a second multiple bit digital value;

b) comparing said first and second multiple bit digital values; and c) upon finding that said first and second multiple bit digital values are equal in the comparing step, manipulating only the least significant bit of at least one of said first and second multiple bit digital values so that their resulting values are rendered non-equal.

18. The method of claim 17, wherein the comparing step further comprises generating at least two output signals, a first output signal when said first and second multiple bit digital values are equal and a second output signal when said first and second digital multiple bit digital values are non-equal.

19. The method of claim 18, wherein said first output signal is one of either a logic HI or a logic LO signal when said values are equal, and said second output signal is the other of either a logic HI or a logic LO signal when said values are non-equal.

20. An electronic circuit for converting two equal values into two non-equal values, one of said values being a first multiple bit digital value having a least significant bit and remaining most significant bits, the other of said values being a second multiple bit digital value having a least significant bit and remaining most significant bits, said circuit comprising:

comparator means for receiving and comparing said first and second multiple bit digital values, said comparator means having an output, said comparator means capable of producing at least two output signals, a first output signal when said values are equal and a second output signal when said values are non-equal; and logic means for receiving said comparator means output and said least significant bit of each of said first and second multiple bit digital values, said logic means manipulating only one of the bits of at least one of said first and second multiple bit digital values so that the resulting multiple bit digital values are rendered non-equal.

* * * * *